(12) United States Patent  
Ma et al.

(10) Patent No.: US 10,230,049 B2  
(45) Date of Patent: Mar. 12, 2019

(54) POLYMER-PEROVSKITE FILMS, DEVICES, AND METHODS

(71) Applicant: Florida State University Research Foundation, Inc., Tallahassee, FL (US)

(72) Inventors: Biwu Ma, Tallahassee, FL (US); Hanwei Gao, Tallahassee, FL (US); Yu Tian, Tallahassee, FL (US); Yichuan Ling, Tallahassee, FL (US)

(73) Assignee: Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 15/868,647

(22) Filed: Jan. 11, 2018

(65) Prior Publication Data

US 2018/0159041 A1    Jun. 7, 2018

Related U.S. Application Data

(62) Division of application No. 15/236,072, filed on Aug. 12, 2016, now Pat. No. 9,905,765.

(Continued)

(51) Int. Cl.  
*H01L 51/00* (2006.01)  
*H01L 51/50* (2006.01)

(52) U.S. Cl.  
CPC .... *H01L 51/0034* (2013.01); *C08G 2261/512* (2013.01); *C08G 2261/91* (2013.01);

(Continued)

(58) Field of Classification Search  
CPC ............. H01L 51/0034; H01L 51/0026; H01L 51/5056; H01L 2251/301;

(Continued)

(56) References Cited

U.S. PATENT DOCUMENTS 9,570,240 B1 * 2/2017 Durstock ............. H01G 9/2013  
2014/0283896 A1    9/2014 Lunt, III (Continued)

FOREIGN PATENT DOCUMENTS

CN    104861958      8/2015  
KR     1750275    *  6/2017

OTHER PUBLICATIONS

Chao et al., "Fabrication of CH3NH3PbI3/PVP Composite Fibers via Electrospinning and Deposition", Materials, 8, 5467-5478 (2015).*

(Continued)

*Primary Examiner* — Peter Bradford  
(74) *Attorney, Agent, or Firm* — Eversheds Sutherland (US) LLP

(57) ABSTRACT

Provided herein are perovskite-polymer films, methods of forming polymer-perovskite films, and devices including polymer-perovskite films. The polymer-perovskite films may include a plurality of methylammonium lead chloride ($CH_3NH_3PbCl_3$) nanopillar crystals embedded in a polymer matrix. The devices can be optoelectronic devices, such as light emitting diodes, which include polymer-perovskite films. The polymer-perovskite films of the devices can be hole transport layers in the devices. The methods of making films may include spin casting a precursor solution followed by thermal annealing.

14 Claims, 8 Drawing Sheets

Related U.S. Application Data

(60) Provisional application No. 62/204,504, filed on Aug. 13, 2015.

(52) U.S. Cl.
CPC ...... *H01L 51/0026* (2013.01); *H01L 51/5056* (2013.01); *H01L 2251/301* (2013.01); *H01L 2251/5369* (2013.01)

(58) Field of Classification Search
CPC .......... H01L 2251/5369; H05K 999/99; C08G 2261/512; C08G 2261/91
See application file for complete search history.

(56) References Cited

U.S. PATENT DOCUMENTS

| | | |
|---|---|---|
| 2016/0141535 A1 | 5/2016 | Snaith |
| 2016/0343965 A1 | 11/2016 | Marks |
| 2016/0365525 A1 | 12/2016 | Sugimura |
| 2017/0054099 A1 | 2/2017 | Friend |
| 2017/0130326 A1 | 5/2017 | Wei |
| 2017/0152608 A1 | 6/2017 | Jin |
| 2017/0186559 A1 | 6/2017 | Zhu |
| 2017/0186818 A1 | 6/2017 | Yen |
| 2017/0213967 A1 | 7/2017 | Chen |
| 2017/0217785 A1 | 8/2017 | Yang |
| 2017/0250030 A1 | 8/2017 | Druffel |

OTHER PUBLICATIONS

Unger, "Chloride in Lead Chloride-Derived Organo-Metal Halides for Perovskite-Absorber Solar Cells", Chemistry of Materials, 26, 7158-7165 (2014).*

Butler et al., "Band Alignment of theHybrid halide Perovskites CH3NH3PbCl3, CH3NH3PbBr3 and CH3NH3Pbl3," Mater. Horz., 2015, 2:228-231.

Butler et al., "Band Alignment of theHybrid halide Perovskites CH3NH3PbCl3, CH3NH3PbBr3 and CH3NH3Pbl3," Mater. Horz., 2015, 2:228-231.

Li et al., "Efficient Llght-Emitting Diodes Based on Nanocrystalline Perovskite in a Dielectric Polymer Matrix," Nano Lett., 2015, 15:2640-2644.

Zhou et al., "In Situ Fabrication of Halide Perovskite nanocrystal-Embedded Polymer Composite Films with Enhanced Photoluminescence for Display Backlights," Adv. Mater., 2016, 28:9163-9168.

Petrov et al., "New Insight into the Formation of Hybrid Perovskite Nanowires via Structure Directing Adducts," Chem. Mater., 2017, 29:587,594.

Ren et al., "Turning a Disadvantage into an Advantage: Synthesizing High-Quality Organometallic Halide Perovskite Nanosheet Arrays for Humidity Sensors," J. Mater. Chem. C, 2017, 5:2504.

* cited by examiner

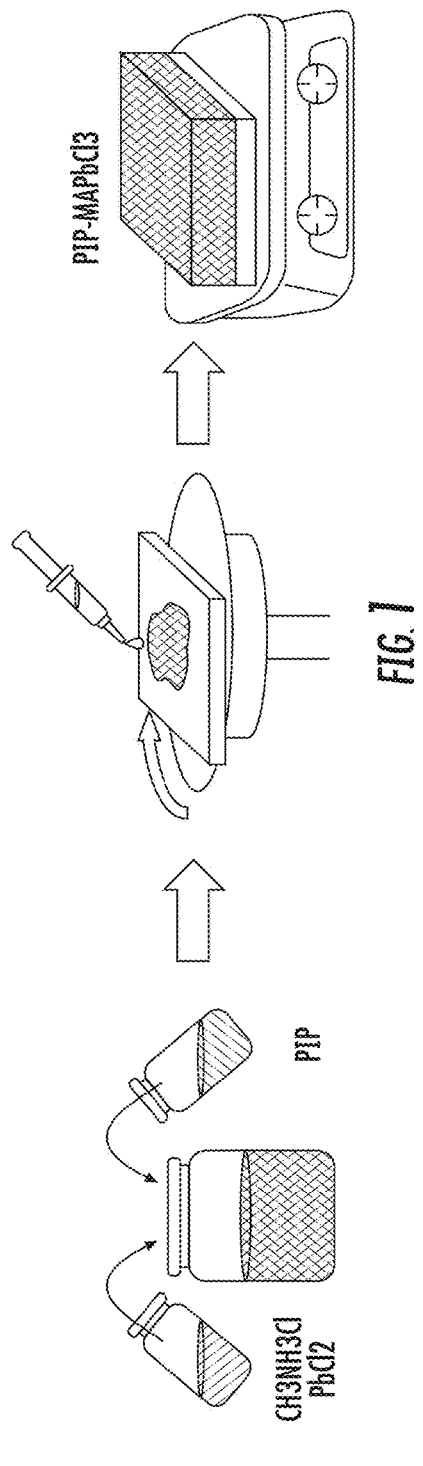
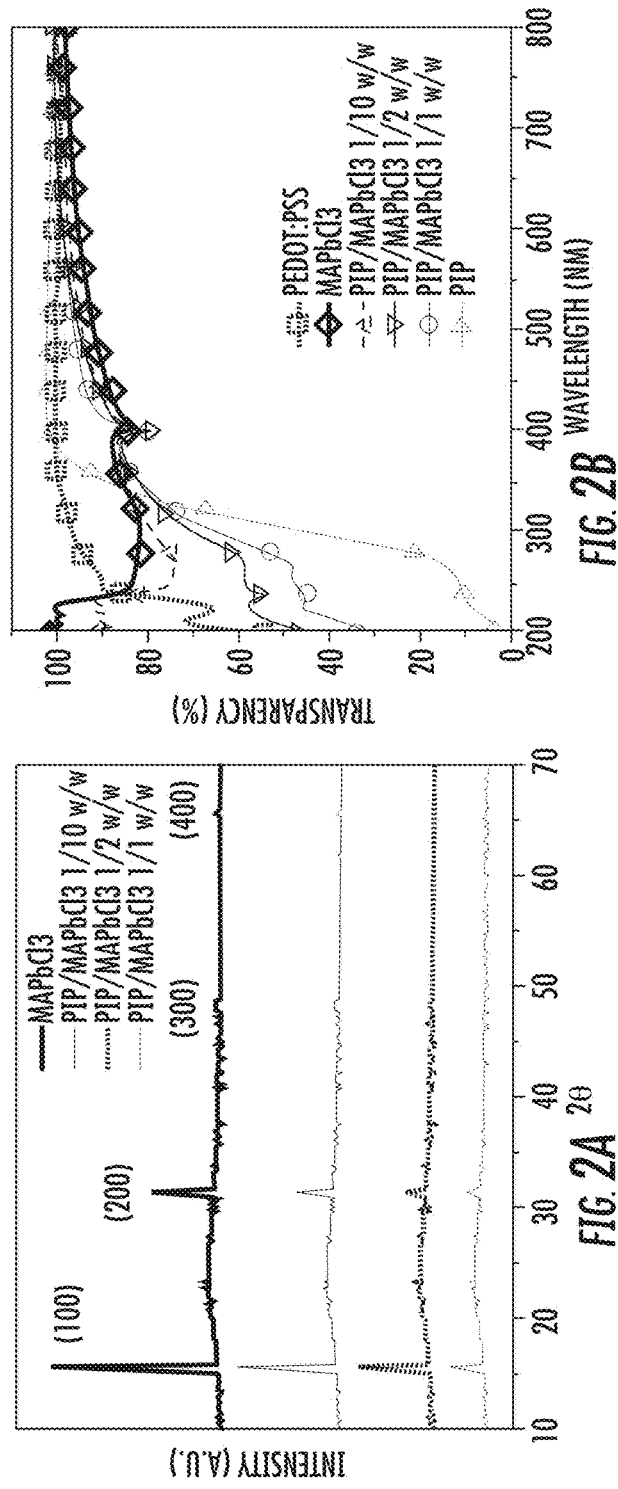
FIG. 1
FIG. 2A
FIG. 2B

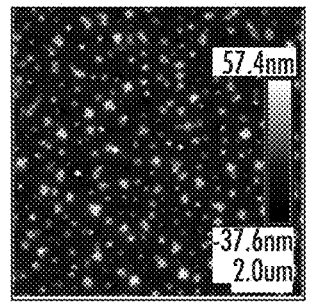 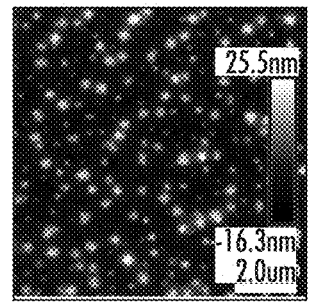 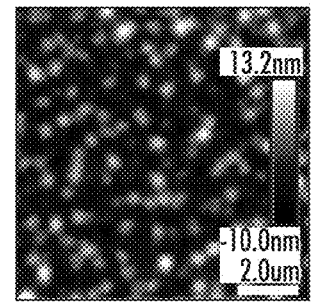
FIG. 3A  FIG. 3B  FIG. 3C
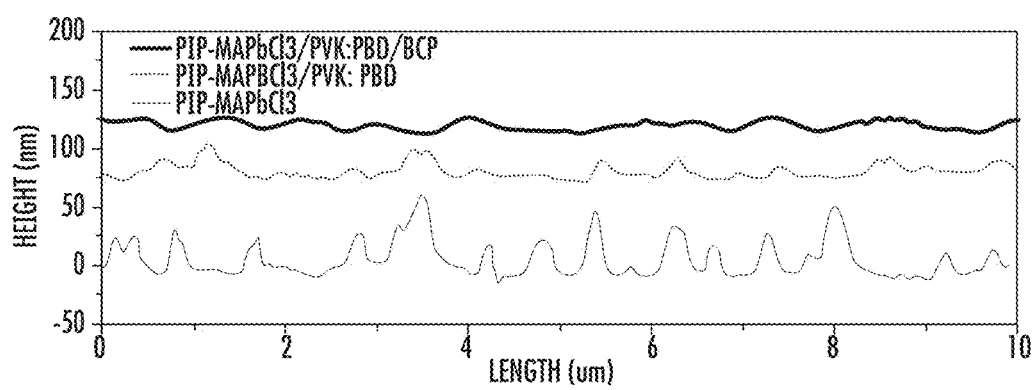
FIG. 3D
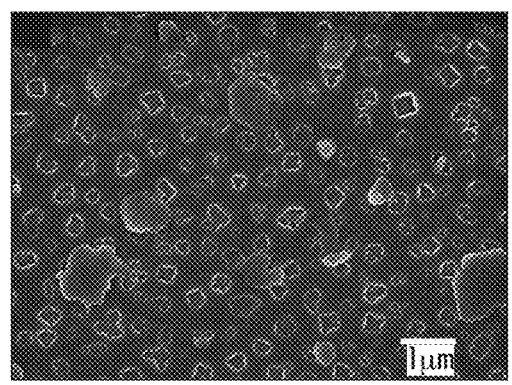 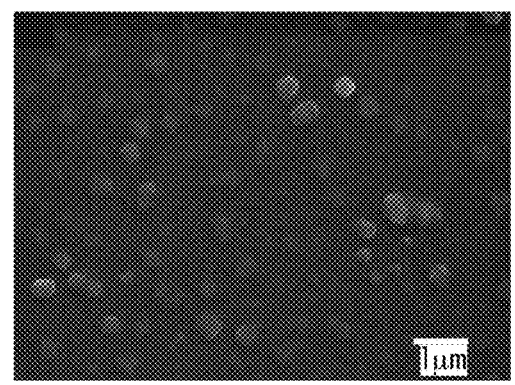
FIG. 4A  FIG. 4B

POLYMER-PEROVSKITE FILMS, DEVICES, AND METHODS

CROSS-REFERENCE TO RELATED APPLICATIONS

This application is a divisional application of U.S. patent application Ser. No. 15/236,072, filed Aug. 12, 2016, which claims priority to U.S. Provisional Patent Application No. 62/204,504, filed Aug. 13, 2015. The content of these applications is incorporated by reference.

BACKGROUND

Thin film optoelectronic devices have experienced significant advancement over the last decade. Light emitting diodes (LEDs) based on organics, polymers, and quantum dots have achieved high efficiencies and long lifetimes suitable for applications in full color displays and solid-state lighting. Organic/polymeric photovoltaic cells (PVs) have been established as a promising low-cost solar energy conversion technology with power conversion efficiencies improved from about 1% to more than 10%. Typically, optoelectronic devices are configured with a layered structure, with the photoactive (either light emitting or light harvesting) layer sandwiched between charge transport layers in contact with two electrodes. The charge transport layers, i.e. hole transport layer (HTL) and electron transport layer (ETL), may play important roles in determining device performance.

A desirable hole transport material can have suitable energy levels, with large band gap and high hole conductivity, efficient hole injection and transport, as well as electron and exciton blocking. A variety of solution processable hole transport materials have been developed during the last decade, including organic molecules, metal oxides, and polymers, e.g., poly(3,4-ethylenedioxythiophene):poly(styrenesulfonate) (PEDOT:PSS). Of these, PEDOT:PSS might be the most recognized material due to its good conductivity, high transparency, and suitable work function.

However, there are many intrinsic limitations associated with PEDOT:PSS. For example, its acidity and/or hygroscopic nature can lead to device instability and/or degradation, and its low lowest unoccupied molecular orbital (LUMO) energy level and band gap can result in weak electron blocking and/or pronounced exciton quenching. Crosslinkable organic/polymeric hole transport materials, which allow for the formation of a solvent-resistant layer via crosslinking after solution processing, have been explored for multilayer structured devices, in particular OLEDs. However, the preparation of crosslinkable materials often is not straightforward, and typically involves multiple synthesis and/or purification steps, which can be costly. Transition metal oxides, such as oxides of nickel (NiOx), molybdenum (MoOx), tungsten (WOx), and vanadium (VOx), represent another class of hole transport materials that has been pursued. Solution processed metal oxide HTLs are mainly obtained by either thermal decomposition of organic-inorganic hybrid precursors or annealing of nanoparticles capped with organic solubilizing/stabilizing groups. Important issues related to solution processed oxide thin films include defect states due to stoichiometry deviations, residual —OH groups, and/or organic residues, which can negatively impact the device efficiency and stability.

Recently, earth-abundant organometal halide perovskites have attracted attention because one or more of their properties, such as optical and/or electrical properties, can make them suitable for low-cost high-performance optoelectronic devices. These properties can include facile low-temperature synthesis, solution processability, highly tunable direct band gaps across the visible to infrared regions, and/or extremely high charge carrier mobilities. Success has been realized for perovskite based PVs, with device efficiencies increasing from about 3% to about 20%, or more. Electrically driven LEDs and optically pumped lasers also have been demonstrated with these organic-inorganic hybrid semiconductors.

Methylammonium (MA) lead chloride ("$CH_3NH_3PbCl_3$" or "$MAPbCl_3$") has optical and electronic properties suitable for application in hole transport layers, i.e. transparency in the visible region due to a wide band gap of about 3.1 eV, high conductivity, and high hole mobility. Methylammonium lead chloride also can be synthesized by reacting MACl with $PbCl_2$, in the same way as other methylammonium lead halide perovskites, such as $MAPbI_3$ and $MAPbBr_3$.

However, preparing high quality neat $MAPbCl_3$ thin films via solution processing is more challenging than preparing high quality neat films of $MAPbI_3$ or $MAPbBr_3$. Not wishing to be bound by any particular theory, it is believed that this difference may be due to the lower solubility of chloride precursors and/or faster crystallization kinetics. Due to one or both of these features, spin coating a dimethylformamide (DMF) precursor solution containing MACl and $PbCl_2$ typically leads to the formation of relatively large $MAPbCl_3$ crystals with poor surface coverage and/or roughness.

Therefore, films of, or containing, methylammonium lead chloride crystals that do not suffer from one or more of the foregoing disadvantages are desired.

BRIEF SUMMARY

Provided herein are perovskite-polymer films, methods of forming polymer-perovskite films, and devices including polymer-perovskite films.

In embodiments, the polymer-perovskite films comprise a plurality of methylammonium lead chloride nanopillar crystals embedded in a polymer matrix.

In embodiments, the devices provided herein are optoelectronic devices comprising an electrode; a counter electrode; and an electroluminescent layer or a photoactive layer; wherein the hole transport layer and the electroluminescent layer or the photoactive layer are arranged between the electrode and the counter electrode, and the hole transport layer is arranged between the electrode and the electroluminescent layer or the photoactive layer.

In embodiments, the methods of forming a polymer-perovskite film comprise providing a precursor mixture comprising a polymer precursor, a perovskite precursor, and at least one liquid; spin casting the precursor mixture to form a film; and annealing the film to convert the polymer precursor to a polymer, and the perovskite precursor to a perovskite crystal, wherein the perovskite crystal comprises a methylammonium lead chloride ($CH_3NH_3PbCl_3$) crystal.

BRIEF DESCRIPTION OF THE DRAWINGS

FIG. 1 depicts a schematic of one embodiment of the methods provided herein for making a polymer-perovskite film.

FIG. 2A depicts an X-ray diffraction pattern (XRD) of neat $MAPbCl_3$ and one embodiment of a polymer-perovskite film.

FIG. 2B depicts transmittance spectra of a PEDOT:PSS film, a MAPbCl$_3$ film, a polyimide film, and one embodiment of a polymer-perovskite film.

FIG. 3A is an AFM image of one embodiment of a polymer-perovskite film.

FIG. 3B is an AFM image of one embodiment of layers of an optoelectronic device.

FIG. 3C is an AFM image of one embodiment of layers of an optoelectronic device.

FIG. 3D depicts AFM cross-section profiles of the films of FIG. 3A, FIG. 3B, and FIG. 3C.

FIG. 4A is an SEM image of one embodiment of an indium tin oxide (ITO)/polymer-perovskite film.

FIG. 4B depicts an SEM image of one embodiment of layers of an optoelectronic device.

DETAILED DESCRIPTION

Figure 5A:
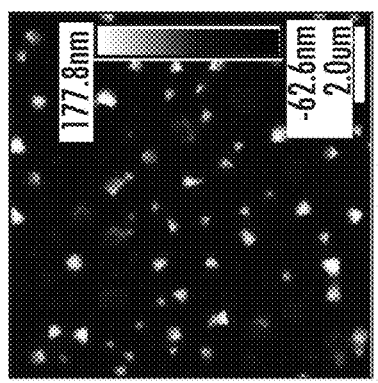
FIG. 5A depicts the morphology of a film having a particular weight ratio of one embodiment of a polymer-perovskite film.
Figure 5A:
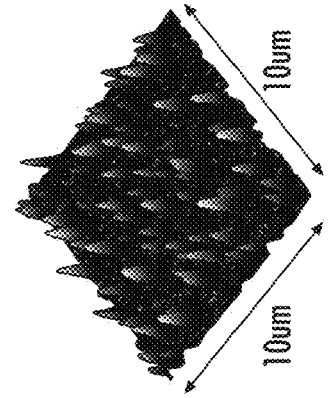

Provided herein are polymer-perovskite films that include methylammonium lead chloride crystals embedded in a polymer matrix. Embodiments of the films provided herein lack the roughness commonly associated with films containing methylammonium lead chloride. The films provided herein, in certain embodiments, also include crystals of methylammonium lead chloride that can provide electrical contacts in optoelectronic and other devices, and the electrical contacts may serve as charge transport channels. For example, the crystals of methylammonium lead chloride can have structures that interpenetrate adjacent layers of an optoelectronic device, such as a hole transport layer and a light emitting layer, thereby providing large interfaces between the crystals and a light emitting layer or photoactive layer. As a result, the perovskite crystals can create electrical contacts between an anode and a light emitting layer or photoactive layer to provide or enhance hole transport, and the polymer matrix can be a substantially smooth insulating base layer that can prevent adjacent layers from directly contacting each other, and/or prevent current leakages.

Also provided are methods for making films containing methylammonium lead chloride crystals, and devices, including optoelectronic devices, comprising the films.

Perovskite Crystals

The methylammonium lead chloride crystals, in one embodiment, are nanopillars or nanopillar crystals. The term "nanopillars" and the phrase "nanopillar crystals", as used herein, generally refer to crystals having an average length of about 25 to about 250 nm, and an average width of about 2 to about 20 nm. The nanopillars or nanopillar crystals, in a particular embodiment, are substantially cylindrical, and, in such embodiments, the "width" refers to the average diameter. The nanopillars or nanopillar crystals, in a certain embodiment, are substantially ribbon shaped, and, in such embodiments, the "width" refers to the average size of the second largest dimension of the ribbon-shaped crystals. Typically, the second largest dimension of the ribbon-shaped crystals is the distance across the "ribbon." In some embodiments, the nanopillars or nanopillar crystals have a hybrid structure that includes substantially cylindrical and substantially ribbon shaped portions. The nanopillars or nanopillar crystals also may be tapered, e.g., at one or more ends, one or more portions between the ends, or a combination thereof.

Polymer Matrix

In embodiments, the methylammonium lead chloride crystals are embedded in a polymer matrix. The polymer matrix generally may include any polymer or combination of polymers that is compatible with the methylammonium lead chloride crystals, and, in some embodiments, suitable for use in an optoelectronic device. The polymer matrix, in one embodiment, comprises a polyimide.

In one embodiment, the polyimide comprises a dianhydride monomer and a diamine monomer. In an additional embodiment, the polyimide comprises a dianhydride monomer and a dianiline monomer. In a still further embodiment, the polyimide comprises a dianhydride monomer, a dianiline monomer, and a diamine monomer. In a certain embodiment, the polyimide comprises poly(3,3',4,4'-benzophenonetetracarboxylic dianhydride-co-4,4'-oxydianiline/1,3-phenylenediamine).

In embodiments, the methylammonium lead chloride crystals are embedded in the polymer matrix. The term "embedded", as used herein, refers to methylammonium lead chloride crystals that are entirely disposed within the polymer matrix, methylammonium lead chloride crystals of which at least a portion of their structure is disposed within the polymer matrix, or a combination thereof. For example, one end of a methylammonium lead chloride crystal may be disposed within a polymer matrix, while the other end of the methylammonium lead chloride crystal protrudes, at any angle and to any extent, from the polymer matrix. Or, as a further example, one side of a methylammonium lead chloride crystal may be disposed within a polymer matrix along the crystal's entire length or a portion thereof, while the other side the methylammonium lead chloride crystal is not embedded in the polymer matrix, thereby exposing the other side of the crystal. The term "embedded" also applies to other layers of the devices provided herein, including the electroluminescent layers or photoactive layers. For example, a polymer matrix in which methylammonium lead chloride crystals are embedded may contact an adjacent layer, such as an electroluminescent or photoactive layer, and one or more of the methylammonium lead chloride crystals may be embedded in both layers. As a further example, a methylammonium lead chloride crystal may have one portion of its structure disposed in the polymer matrix, and another portion of its structure disposed in an adjacent layer that contacts the polymer matrix.

The methylammonium lead chloride crystals that are embedded in a polymer matrix generally may be oriented in any manner. In one embodiment, the methylammonium lead chloride crystals are oriented substantially perpendicularly to a surface of the polymer matrix. In another embodiment, the methylammonium lead chloride crystals are oriented substantially parallel to a surface of the polymer matrix. In yet another embodiment, a first portion of the methylammonium lead chloride crystals are oriented substantially perpendicularly to a surface of the polymer matrix, and a second portion of the methylammonium lead chloride crystals are oriented substantially parallel to a surface of the polymer matrix.

In embodiments, the methylammonium lead chloride crystals are substantially evenly dispersed in the polymer matrix. In one embodiment, the methylammonium lead chloride crystals are substantially evenly dispersed in the polymer matrix, and have a substantially similar crystal size. In another embodiment, the methylammonium lead chloride crystals are substantially evenly dispersed in the polymer matrix, and have a plurality of different crystal sizes. The density of crystals of substantially similar size among those having a plurality of different crystal sizes may vary, or may be substantially uniform. In yet another embodiment, the methylammonium lead chloride crystals are substantially evenly dispersed in the polymer matrix, and at least a portion of the crystals have a substantially similar orientation. For example, methylammonium lead chloride crystals in a polyimide polymer, which may comprise poly(3,3',4,4'-benzophenonetetracarboxylic dianhydride-co-4,4'-oxydianiline/1,3-phenylenediamine), may have a crystalline orientation with (100) (200) (300) crystalline planes along with the glass substrate and/or electrode. In other embodiments, the methylammonium lead chloride crystals are substantially randomly dispersed in the polymer matrix. In a particular embodiment, the methylammonium lead chloride crystals are substantially randomly dispersed in the polymer matrix, and have a plurality of different crystal sizes or substantially similar crystals sizes. In yet another particular embodiment, the methylammonium lead chloride crystals are substantially randomly dispersed in the polymer matrix, have a plurality of different crystal sizes or substantially similar crystals sizes, and a substantially similar crystal orientation or substantially random crystal orientation. In further embodiments, the density of methylammonium lead chloride crystals is greatest at the center of the film.

Generally the films may be of any width and length that is suitable for use in various devices, including the optoelectronic devices provided herein. In one embodiment, the polymer matrix of the film has a thickness of about 1 to about 60 nm. In another embodiment, the polymer matrix of the film has a thickness of about 10 to about 60 nm. In a further embodiment, the polymer matrix of the film has a thickness of about 20 to about 60 nm. In yet another embodiment, the polymer matrix of the film has a thickness of about 30 to about 60 nm. These ranges are provided for the thickness of the polymer matrix and not the film generally, because at least a portion of the methylammonium lead chloride crystals may protrude from the polymer matrix.

In embodiments, the weight ratio of polymer matrix to methylammonium lead chloride crystals is about 1:10 to about 10:1. In one embodiment, the weight ratio of polymer matrix to methylammonium lead chloride crystals is about 1:10 to about 1:1. In another embodiment, the weight ratio of polymer matrix to methylammonium lead chloride crystals is about 1:2 to about 1:1. In a further embodiment, the weight ratio of polymer matrix to methylammonium lead chloride crystals is about 1:10. In a particular embodiment, the weight ratio of polymer matrix to methylammonium lead chloride crystals is about 1:2. In a still further embodiment, the weight ratio of polymer matrix to methylammonium lead chloride crystals is about 1:1.

Methods of Forming Films The films provided herein may be formed by spin casting a precursor mixture comprising a polymer precursor, a perovskite precursor, and at least one liquid. One embodiment of the methods provided herein is depicted at FIG. 1.

The perovskite precursor, in embodiments, includes lead chloride ($PbCl_2$) and methylammonium chloride ($CH_3NH_3Cl$). In further embodiments, the perovskite precursor includes lead chloride ($PbCl_2$), methylammonium chloride ($CH_3NH_3Cl$), and the contact products thereof. As used herein, the phrase "contact products" refers to compositions of matter that may result when lead chloride ($PbCl_2$) and methylammonium chloride ($CH_3NH_3Cl$) contact each other, including methylammonium lead chloride.

The polymer precursor may include one or more monomers capable of forming a polymer matrix. The polymer precursor may include a single type of monomer, or, alternatively, two or more types of monomers. In embodiments, the polymer precursor is a polyimide precursor. A "polyimide precursor" includes monomers capable of forming a polyimide. Therefore, the polyimide precursor, in some embodiments, comprises a dianhydride monomer, and at least one of a diamine monomer and a dianiline monomer. In a particular embodiment, the polyimide precursor comprises the monomers of poly(3,3',4,4'-benzophenonetetracarboxylic dianhydride-co-4,4'-oxydianiline/1,3-phenylenediamine).

The at least one liquid of the precursor mixture may include N-methyl-2-pyrrolidone, dimethyl formamide, dimethyl sulfoxide, or a combination thereof. Not wishing to be bound by any particular theory, it is believed that dimethyl sulfoxide may improve the solubility of methylammonium lead chloride.

The precursor mixture may be formed by any means known in the art. For example, the precursor mixture may be formed by combining the polymer precursor, the perovskite precursor, and the at least one liquid in any order. Alternatively, the precursor mixture may be formed by combining two or more mixtures, each containing one or more liquids and at least one of the polymer precursor or a portion thereof and the perovskite precursor or a portion thereof.

In one embodiment, the precursor mixture is formed by combining a first mixture comprising the polymer precursor and N-methyl-2-pyrrolidone, and a second mixture comprising the perovskite precursor and at least one of dimethyl formamide (DMF) and dimethyl sulfoxide (DMSO). In a particular embodiment, the second mixture comprises dimethyl formamide and dimethyl sulfoxide at a volume ratio of about 5:3 to about 9:3 of DMF:DMSO. In a further embodiment, the second mixture comprises dimethyl formamide and dimethyl sulfoxide at a volume ratio of about 7:3 of DMF:DMSO. In further embodiments, the second mixture is formed by combining a mixture comprising methylammonium chloride (CH$_3$NH$_3$Cl), DMF, and DMSO with a mixture comprising lead chloride (PbCl$_2$), DMF, and DMSO. The mixture comprising methylammonium chloride, DMF, and DMSO may have a concentration of methylammonium chloride of about 0.15 to about 0.25 M. The mixture comprising lead chloride, DMF, and DMSO may have a concentration of lead chloride of about 0.05 to about 0.15 M.

The methods provided herein may include spin casting the precursor mixture to form a film. Any spin casting apparatus and/or technique known in the art may be used. In one embodiment, spin casting is performed at a rate of about 1500 to about 6000 rpm. In a particular embodiment, spin casting is performed at a rate of 3000 rpm. The spin casting may be performed for a time sufficient to form a film from the precursor mixture. The spin casting may be performed at a time of about 15 seconds to about 45 seconds. In a certain embodiment, spin casting is performed for 30 seconds. In a further embodiment, spin casting is performed at a rate of about 3000 rpm for about 30 seconds.

The methods provided herein may include annealing the film. The film is annealed, in embodiments, by heating the film to a temperature of about 50 to about 100° C., or about 60 to about 100° C. The annealing step may convert the polymer precursor to a polymer. The phrase "convert the polymer precursor to a polymer" encompasses embodiments in which the polymerization of the polymer precursor does not begin prior to the annealing step, and embodiments in which the polymerization and/or cross-linking of the polymer precursor begins prior to the annealing step and is driven to substantial completion by the increased temperature of the annealing step. Not wishing to be bound by any particular theory, it is believed that during the annealing process, the polymer becomes an amorphous thin film or a semi-crystalline thin film, depending on its intrinsic physical and chemical properties. The annealing step also may convert the perovskite precursor to a perovskite crystal. The phrase "convert the perovskite precursor to a perovskite crystal" encompasses embodiments in which the crystallization of the perovskite precursor begins prior to the annealing step, and those embodiments in which the crystallization of the perovskite precursor occurs after the annealing step is started, including during the application of an increased temperature and/or as the film is allowed to cool.

Figure 8A:
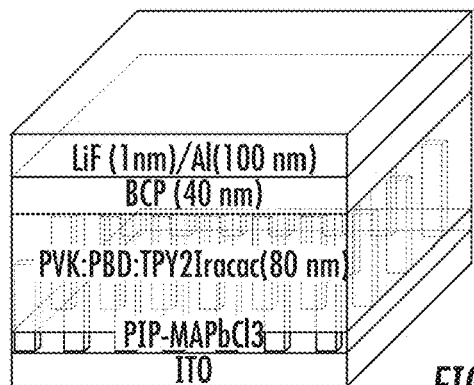
FIG. 8A is a schematic of one embodiment of an optoelectronic device.
Figure 8A:
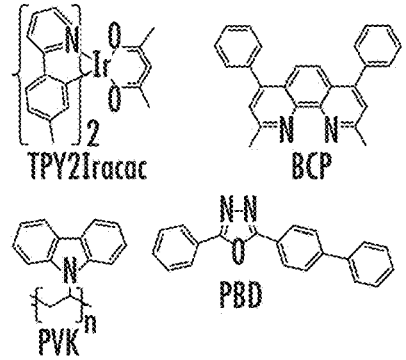
Figure 8B:
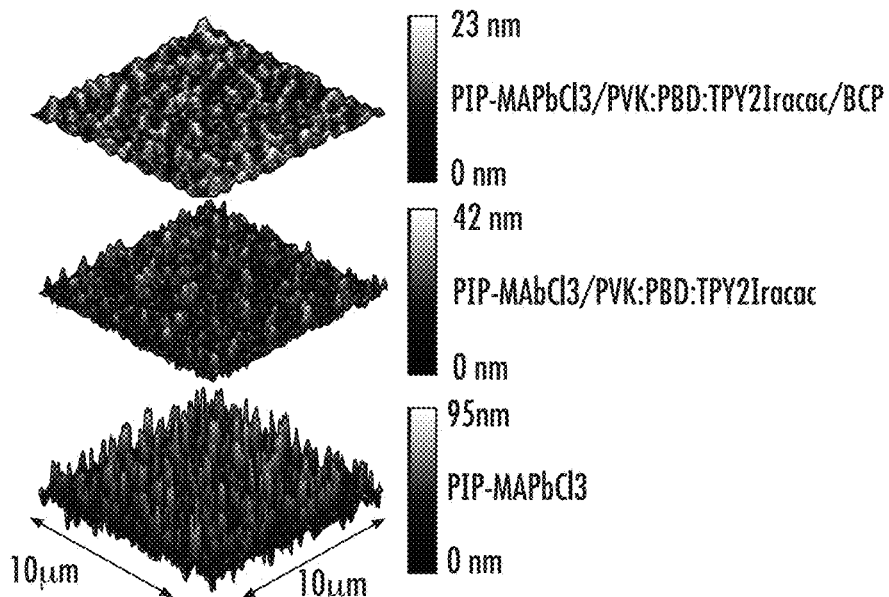
FIG. 8B depicts 3D images of films in one embodiment of an optoelectronic device.

In embodiments, the solution processing of blends of polyimide precursor and methylammonium lead chloride precursors results in films in which methylammonium lead chloride nanopillars are uniformly embedded in the polymer matrix to form "grass" type structures, such as those depicted at FIG. 1 and FIG. 8B.

Hole Transport Layers and Optoelectronic Devices

Provided herein are optoelectronic devices that include a polymer-perovskite film. A polymer-perovskite film, as provided herein, is a hole transport layer in embodiments of the optoelectronic devices.

In embodiments, the optoelectronic devices comprise an electrode, a counter electrode, a hole transport layer, and an electroluminescent layer or a photoactive layer. The hole transport layer and the electroluminescent layer or the photoactive layer may be arranged between the electrode and the counter electrode, and the hole transport layer may be arranged between the electrode and the electroluminescent layer or the photoactive layer.

In embodiments, the optoelectronic devices further comprise an electron transport layer. The electron transport layer may be arranged between the counter electrode and the electroluminescent layer or the photoactive layer. The electron transport layer may include any material or materials capable of transporting electrons. The electron transport layer also may be a hole/exciton blocking layer. In one embodiment, the electron transport material comprises bathocuproine (BCP). The electron transport layer may have a thickness of about 30 nm to about 50 nm. In a particular embodiment, the electron transport layer has a thickness of about 40 nm. In a certain embodiment, the electron transport layer comprises a layer of BCP having a thickness of about 40 nm.

In one embodiment, the electrode is an anode, and the counter electrode is a cathode. The anode may comprise indium tin oxide (ITO). The cathode may comprise LiF and Al. For example, the cathode may include a layer of LiF having a thickness of about 0.5 nm to about 5 nm, and a layer of Al having a thickness of about 80 nm to about 120 nm. In a certain embodiment, the cathode comprises a layer of LiF having a thickness of about 1 nm, and a layer of Al having a thickness of about 100 nm. The anode or the cathode may be disposed on a substrate, such as a glass substrate or a polyethylene terephthalate (PET) substrate, which may be flexible. In a particular embodiment, the ITO anode is disposed on a glass substrate.

In embodiments, the optoelectronic devices comprise an electroluminescent layer, and the device is a light emitting diode. The electroluminescent layer may comprise any light emitting material and/or hosts known in the art. In one embodiment, the light emitting material comprises a green phosphorescent emitter. The green phosphorescent emitter may be bis[5-methyl-2-(2-pyridinyl-N)phenyl-C](2,4-pentanedionato-O$^2$,O$^4$)iridium(III), which is referred to herein as "(TPY)$_2$Iracac," and has the following structure:

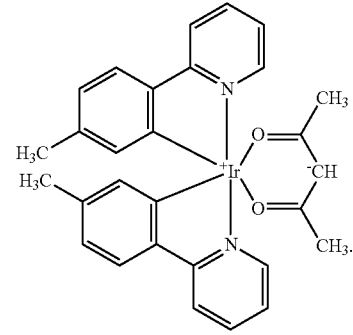

The light emitting material of the electroluminescent layer may be disposed in one or more host materials. When a host material is present, the light emitting material may be present in the electroluminescent layer in an amount of about 2 to about 10 weight % by weight of electroluminescent layer. In a particular embodiment, the light emitting material is present in the electroluminescent layer in an amount of about 5% by weight of the electroluminescent layer. The host material, in some embodiments, comprises poly(9-vinylcarbazole), referred to herein as "PVK", 2-(4-biphenylyl)-5-phenyl-1,3,4-oxadiazole, referred to herein as "PBD", or a combination thereof. In a particular embodiment, the host material comprises PVK and PBD. The weight ratio of PVK:PBD may be about 50:50 to about 90:10. The weight ratio of PVK:PBD may be about 70:30. In a still further embodiment, the electroluminescent layer comprises (TPY)$_2$Iracac, PVK, and PBD, wherein the PVK:PBD is present at a weight ratio of about 70:30, and the (TPY)$_2$Iracac is present in the electroluminescent layer in an amount of about 5% by weight of the electroluminescent layer.

The electroluminescent layer, in one embodiment, has a thickness of about 50 to about 100 nm. In a particular embodiment, the electroluminescent layer has a thickness of about 80 nm.

In embodiments, the electroluminescent layer is arranged adjacent to the hole transport layer, and contacts the hole transport layer. When the hole transport layer contacts the electroluminescent layer, one or more of the methylammonium lead chloride crystals embedded in the hole transport layer also may be embedded in the electroluminescent layer.

In embodiments, the optoelectronic devices provided herein comprise a photoactive layer, and the device is a photovoltaic cell.

With the exception of the hole transport layers provided herein, the optoelectronic devices may be fabricated by any means know in the art.

In one embodiment, the hole transport layers may be spin casted onto an anode using the methods provided herein. For example, a glass substrate coated with ITO and/or patterned ITO may be incorporated into the spin casting steps provided herein, thereby creating the hole transport layers on the ITO anode. After the hole transport layer is disposed on the ITO anode, subsequent solution processing may be used to deposit other layers on the hole transport layer, such as an electroluminescent layer, because embodiments of the polymer-perovskite films used as hole transport layers can have limited or no solubility in low polarity organic solvents, e.g. chloroform, chlorobenzene, and toluene.

In embodiments, the optoelectronic device comprises an electroluminescent layer, and is a light emitting diode with the following layer structure in which the methylammonium lead chloride nanopillar crystals are embedded in both the polyimide polymer (PIP) matrix and the PVK:PBD:(TPY)$_2$Iracac electroluminescent layer:

ITO/PIP-MAPbCl$_3$/PVK:PBD:(TPY)$_2$Iracac/BCP/LiF/Al.

In one embodiment, the optoelectronic device provided herein has a turn-on voltage that is about 2 to about 3 V less than a comparable device having a hole transport layer of PEDOT:PSS. In another embodiment, the optoelectronic device provided herein has a luminosity at 10 V that is about 80 to about 120 cd/m$^2$ greater than a comparable device having a hole transport layer of PEDOT:PSS. An example of a comparable device has the following layer structure:

ITO/PEDOT:PSS/PVK:PBD:(TPY)$_2$Iracac/BCP/LiF/Al.

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

EXAMPLES

Unless noted otherwise, the following materials, hardware, and analytical methods were used in the Examples.

PEDOT:PSS (CLEVIOS™ P VP AI 4083) was purchased from Heraeus (Hanau, Germany). CH$_3$NH$_3$Cl, PbCl$_2$, poly-imide precursor (PIP) in N-methyl-2-pyrrolidinone (NMP) solution (product number 431206), PVK, PBD, BCP, LiF, and Al were purchased from Sigma-Aldrich. (TPY)$_2$Iracac was synthesized according to a procedure reported in the literature (see Lamansky, S. et al., *J Am Chem Soc.*, 2001, 123, (18), 4304-4312). Pre-patterned ITO-coated glass substrates (20 Ω/sq) were purchased from the Thin Film Devices, Inc. (Anaheim, Calif., USA).

Thin film optical absorption was measured with a CARY 5000 UV-Vis-NIR spectrophotometer (BRUKER®, Billerica, Mass., USA). The thickness of thin films was determined with a DEKTAK® 150 profilometer (BRUKER®, Billerica, Mass., USA). Atomic force microscopy (AFM) images were taken with a BRUKER® Icon scanning probe microscope in tapping-mode.

X-Ray Diffraction was performed using a custom built HUBER® 4-circle diffractometer with graphite monochromator and analyzer in non-dispersive diffraction geometry (HUBER®, Germany), coupled to a RIGAKU® rotating anode generator producing CuKα radiation (RIGAKU®, USA). SEM images were taken with a ZEISS® 1540XB Crossbeam Scanning Electron Microscope (ZEISS®, USA).

Example 1—Preparation of a Polymer-Perovskite Composite Thin Film

One embodiment of a polymer-perovskite composite thin film was made by the following procedure. CH$_3$NH$_3$Cl and PbCl$_2$ were dissolved in DMF:DMSO mixed solutions (DMF:DMSO,7/3,V/V) at concentrations of 0.2 M and 0.1 M, respectively. The CH$_3$NH$_3$PbCl$_3$ precursor solution was prepared by mixing the CH$_3$NH$_3$Cl and PbCl$_2$ solutions at a 1 to 1 volume ratio.

DMSO was used because it was believed that it enhanced the solubility of CH$_3$NH$_3$PbCl$_3$. By mixing a CH$_3$NH$_3$PbCl$_3$ precursor solution and a PIP precursor solution, composite solutions with PIP/Perovskite weight ratios of 1/10, 1/2, and 1/1 were obtained.

The mixed solution passed through a syringe filter before it was spin casted on substrates at 3000 rpm for 30 seconds. Right after spin casting, thermal annealing was performed at 60° C. for 5 minutes to remove the solvent and fully convert the precursors into PIP-MAPbCl$_3$ composite thin films. Neat MbPbCl$_3$ thin film was prepared by using the same method.

The foregoing embodiment is depicted at FIG. 1, which includes schematics of the steps involved with processing a PIP-MAPbCl$_3$ composite thin film by spin coating and thermal annealing. FIG. 2A depicts an XRD of neat MAPbCl$_3$ and PIP-MAPbCl$_3$ composite thin films, in which the curves are offset for clarity. FIG. 2B depicts transmittance spectra of PEDOT:PSS, MAPbCl$_3$, PIP, and PIP-MAPbCl$_3$ (of Example 1) composite thin films.

Example 2—Phosphorescent OLEDs Fabrication and Testing

ITO-coated glass substrates were cleaned by successive sonication in soap solution, deionized water, acetone, and isopropanol for 15 min at 40° C. and UV ozone cleaned for 20 minutes.

For a device with PEDOT:PSS as HTL, PEDOT:PSS was spin-cast onto the cleaned ITO coated glass substrate at a spin speed of 3000 rpm for 45 s and baked at 140° C. for 20 minutes to get a 40 nm thick thin film.

For the devices with MAPbCl$_3$ as HTLs, the films were prepared by the method of Example 1.

After the deposition of HTL, a solution of 13 mg/mL PVK:PBD (70/30 w/w) containing 5 wt % of $(TPY)_2Iracac$ in chloroform was spin coated on the top at 3000 rpm for 40 s. The thickness was about 80 nm. A 40 nm thick layer of BCP was then deposited at a rate of 1.0 Å/s under high vacuum conditions ($<3\times10^{-6}$ Torr).

After organic film deposition, the chamber was vented, and a shadow mask with a 2 mm wide stripe was placed onto the substrates perpendicular to the ITO stripes. A cathode consisting of 1 nm LiF and 100 nm Al was deposited at a rate of 0.1 Å/s and 4 Å/s, respectively. OLEDs were formed at the 2×2 mm squares where the ITO (anode) and Al (cathode) stripes intersected.

The devices were tested in air within 30 mins after fabrication. The electrical and optical intensity characteristics of the devices were measured with a KEITHLY® 4200 sourcemeter/multimeter coupled to a FDS 1010 Si photodiode (Thorlabs, Inc., USA). Only light emitted from the front face of the device was collected and used in subsequent efficiency calculations. The electroluminescence (EL) spectra were measured on a HORIBA® iHR320 spectrofluorimeter, equipped with a HORIBA® Synapse CCD detection system (Horiba Instruments, Inc., USA). The emission was found to be uniform throughout the area of each device.

Example 3—Analysis of Films

The topology of the thin films was analyzed by AFM. FIG. 3A is an AFM image of one embodiment of a PIP-$MAPbCl_3$ (1/1 w/w) composite HTL. FIG. 3B is an AFM image of one embodiment of the following layers: PIP-$MAPbCl_3$ (1/1 w/w)/PVK:PBD:$(TPY)_2Iracac$ (80 nm). FIG. 3C is an AFM image of one embodiment of the following layers: PIP-$MAPbCl_3$ (1/1 w/w)/PVK:PBD:$(TPY)_2Iracac$ (80 nm)/BCP (40 nm). AFM cross-section profiles of the films of FIG. 3A, FIG. 3B, and FIG. 3C are provided at FIG. 3D (the curves are offset for clarity).

SEM images of the films also were taken to analyze the top surface morphology. FIG. 4A is an SEM image of one embodiment of an ITO/PIP-$MAPbCl_3$ (1/1 w/w) film, and FIG. 4B depicts an SEM image of one embodiment of an ITO/PIP-$MAPbCl^3$ (1/1 w/w)/PVK:PBD:$(TPY)_2Iracac$ (80 nm) film.

Figure 5B:
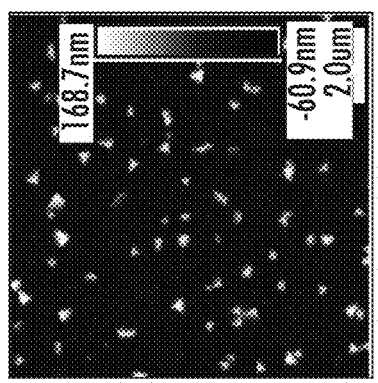
FIG. 5B depicts the morphology of one embodiment of a film.
Figure 5B:
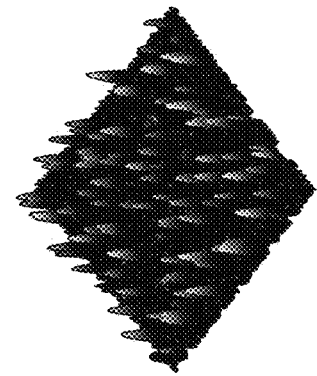
Figure 5C:
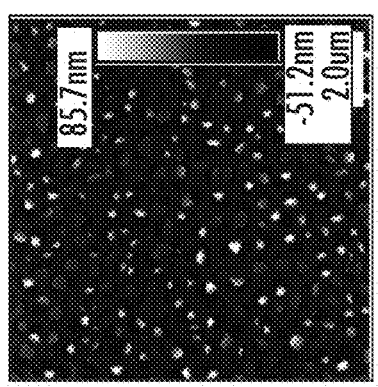
FIG. 5C depicts the morphology of one embodiment of a film.
Figure 5C:
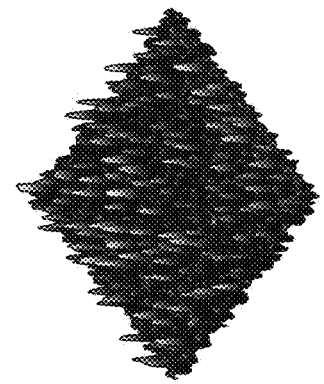
Figure 5D:
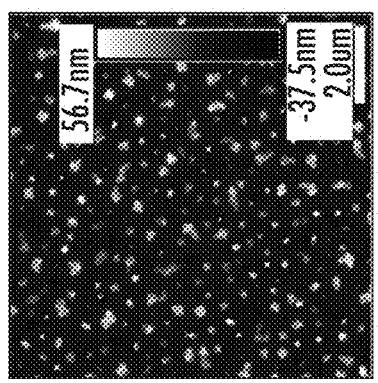
FIG. 5D depicts the morphology of one embodiment of a film.
Figure 5D:
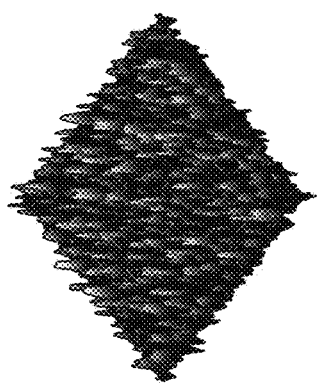

The morphology of PIP-$MAPbCl_3$ composite thin films on ITO/glass substrates with different weight ratios of PIP/$MAPbCl_3$ was characterized by atomic force microscopy (AFM), as shown at FIG. 5A, FIG. 5B, FIG. 5C, and FIG., FD (within these figures, the 3D images have the same height scale bars as the 2D images). The neat $MAPbCl_3$ "thin film" (FIG. 5A) consisted of isolated large crystals with poor surface coverage on the ITO substrate. For the PIP-$MAPbCl_3$ composite thin films, clear nanoscale phase separation between the PIP and $MAPbCl_3$ crystals was observed. The PIP formed a thin base layer attached to the ITO substrate with good surface coverage, whereas the $MAPbCl_3$ formed crystalline nanopillars with one end embedded in the PIP base layer. These polymer-perovskite composite thin films could be considered as "nanograss" with the nanocrystalline $MAPbCl_3$ rooted in the PIP base. As the PIP weight percentage increased up to half amount of the composites, the size of $MAPbCl_3$ nanopillars decreased and their distribution became more uniform and denser, as shown at FIG. 5B, FIG. 5C, and FIG. 5D. The length the $MAPbCl_3$ nanopillars decreased from about 180 nm to about 60 nm when the PIP/$MAPbCl_3$ weight ratio was adjusted from 1/10 (FIG. 5B) to 1/2 (FIG. 5C) to 1/1 (FIG. 5D). This dependence of film morphology on the polymer-perovskite composition has been observed in previously reported light emitting PIP-$MAPbBr_3$ composite thin films (Li et al., NANO LETT. 2015, 15, 2640-2644). Compared to PIP-$MAPbBr_3$ thin films, however, PIP-$MAPbCl_3$ thin films had much larger perovskite crystals and a rougher surface at the same polymer-perovskite weight ratios.

Example 4—Analysis of Green Phosphorescent OLEDs

Also evaluated was the performance of PIP-$MAPbCl_3$ composite thin films as HTL in green phosphorescent OLEDs.

Figure 6:
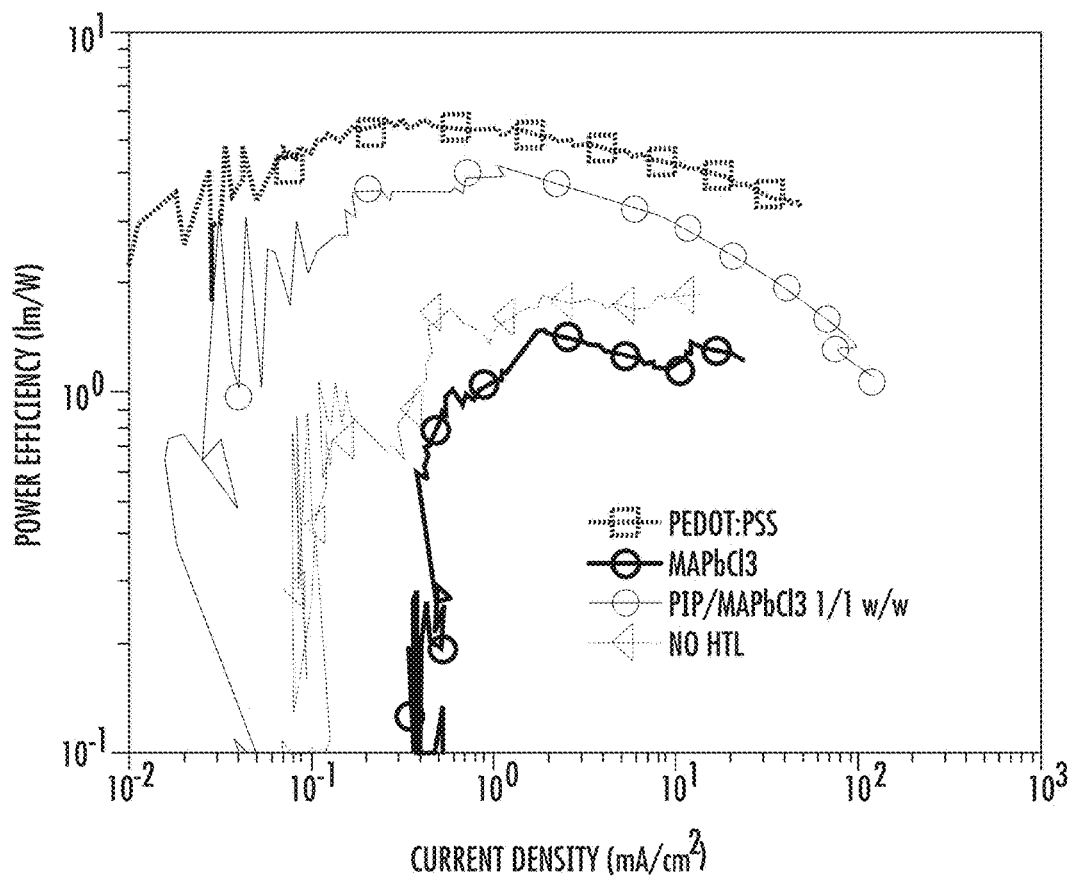
FIG. 6 depicts the device power efficiency characteristics for embodiments of green phosphorescent OLEDs having different hole transport layers.

The performance of the devices of Example 2 having different hole transport layers was tested. FIG. 6 depicts the device power efficiency characteristics for green phosphorescent OLEDs with the following hole transport layers: PEDOT:PSS, $MAPbCl_3$, PIP/$MAPbCl_3$ (1/1 w/w), and no HTL.

Figure 7A:
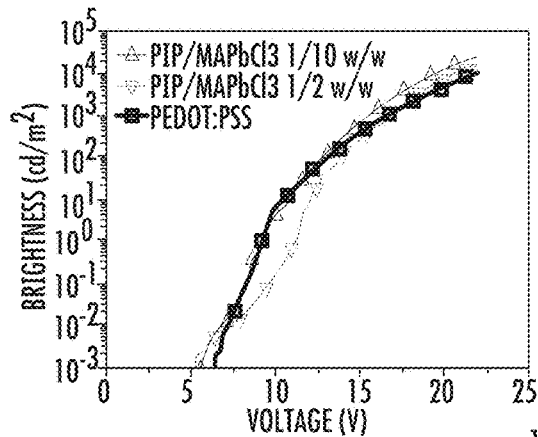
FIG. 7A depicts the brightness-voltage characteristics of different embodiments of optoelectronic devices.
Figure 7B:
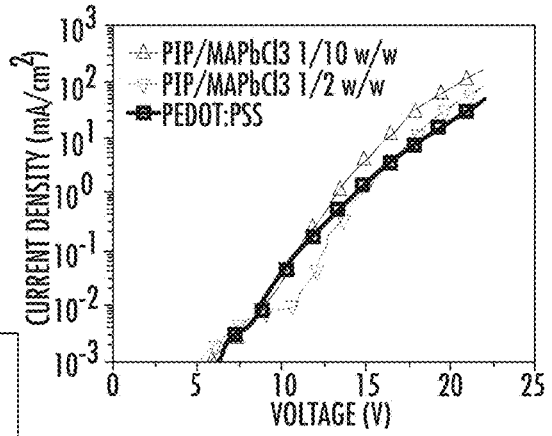
FIG. 7B depicts the current density-voltage characteristics of different embodiments of optoelectronic devices.
Figure 7C:
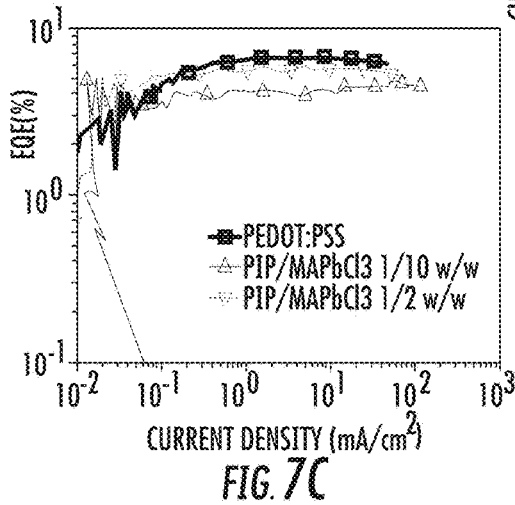
FIG. 7C depicts external quantum efficiency (EQE) versus current density for different embodiments of optoelectronic devices.
Figure 7D:
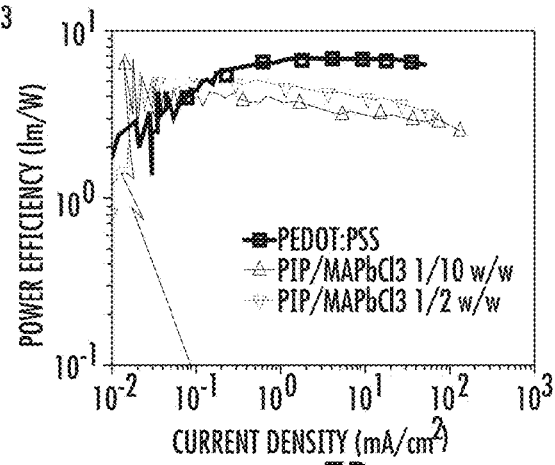
FIG. 7D depicts power efficiency versus current density for different embodiments of optoelectronic devices.

Also measured were the device characteristics for green phosphorescent OLEDs with different PIP:$MAPbCl_3$ ratios: FIG. 7A depicts the brightness-voltage characteristics; FIG. 7B depicts the current density-voltage characteristics; FIG. 7C depicts EQE versus current density; and FIG. 7D depicts power efficiency versus current density.

FIG. 8A depicts one embodiment of the device structure, in which a 80 nm thick electroluminescent layer (EL) comprised a guest-host blend of 5 wt % of the green phosphorescent emitter $(TPY)_2Iracac$ doped in a PVK:PBD (70/30, w/w) host.

A 40 nm thick BCP layer acted as an electron transport and hole/exciton blocking layer. Control devices with a PEDOT:PSS HTL and no HTL were also fabricated and tested for comparison. Unlike typical OLEDs with smooth layer-by-layer structures due to the low surface roughness of each layer, the vertical perovskite nanopillars in the PIP-$MAPbCl_3$ HTLs of this example allowed for the formation of interpenetrating structures with large interfaces between the hole transporting perovskite nanopillars and the light emitting layer.

FIG. 8B depicts the 3D AFM images of the thin films before and after organic layers were deposited on top of the PIP-$MAPbCl_3$ nanograss. It was discovered that the organic materials of this example filled in the void space between nanopillars and created smoother layers with significantly reduced surface roughness (see FIG. 3C), consistent with what was observed in the thin film SEM images shown at FIG. 4A and FIG. 4B.

This suggested that the perovskite nanopillars were embedded in both PIP and PVK:PBD:$(TPY)_2Iracac$ layers. Therefore, the perovskite nanopillars were considered to be a highly conductive element in addition to PVK:PBD for the guest phosphorescent emitter in the EL, and capable, in this example, of directly injecting hole carriers into the EL. The formation of this interpenetrating structure between the HTL and EL was surprisingly constructed by simple solution processing.

Figure 8C:
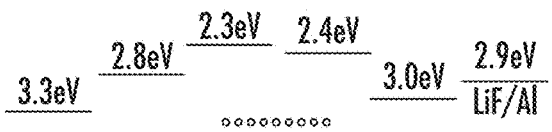
FIG. 8C depicts the energy level diagram for one embodiment of an optoelectronic device.
Figure 8C:
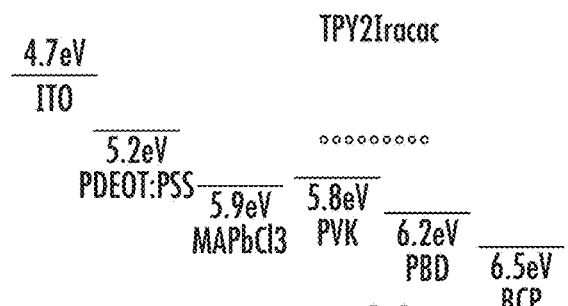

FIG. 8C depicts the corresponding energy level diagram. The highest occupied molecular orbital (HOMO) and lowest unoccupied molecular orbital (LUMO) energy levels of $MAPbCl_3$ were estimated by assuming linear correlations with those of $MAPbBr_3$ and $MAPbI_3$ upon the increasing of the band gap. The deep HOMO energy level of $MAPbCl_3$ aligned well with that of PVK, enabling efficient direct hole injection from the perovskite nanopillars into the PVK:PBD host and/or phosphorescent dopants, once the energy barrier between the ITO anode and the HTL was overcome.

FIG. 9A, FIG. 9B, FIG. 9C, and FIG. 9D depict the electroluminescent spectrum for all the phosphorescent devices with different HTLs. Pure green emission (peak at 523 nm) from the phosphorescent (TPY)$_2$Iracac doped into PVK:PBD was observed, suggesting that recombination primarily occurred in the emitting layer, and that there was efficient energy transfer from the PVK:PBD host to the dopant. No emission from the PIP-MAPbCl$_3$ nanograss itself was observed for this example, likely due to the wide band gaps of PIP and MAPbCl$_3$, as well as the interpenetrating structures that ensured efficient energy transfer from the MAPbCl$_3$ nanopillars to the EL.

Figure 9A:
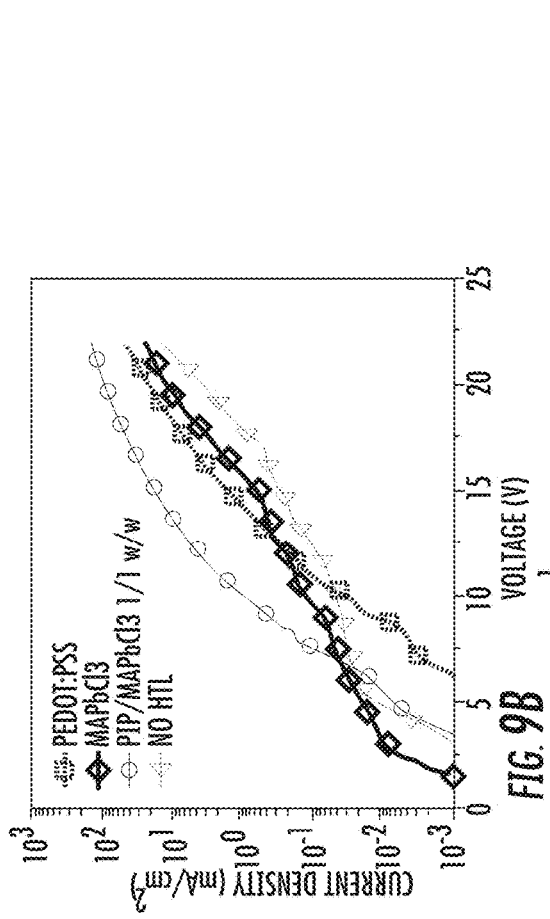
FIG. 9A depicts the electroluminescent spectrum for one embodiment of a phosphorescent device.
Figure 9B:
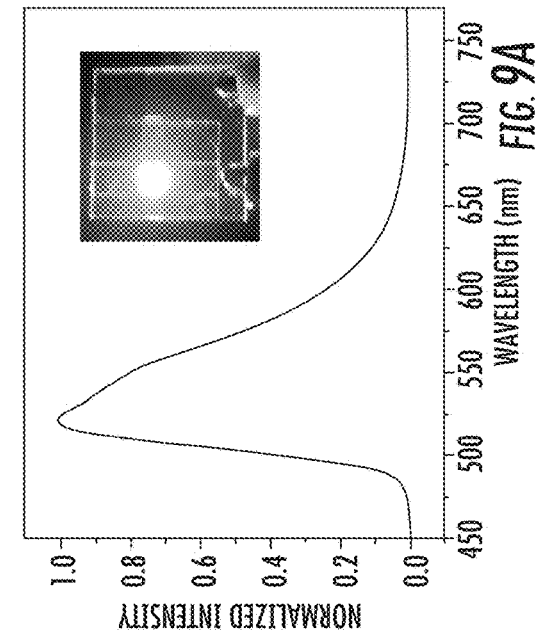
FIG. 9B depicts the current density of various embodiments of optoelectronic devices.
Figure 9D:
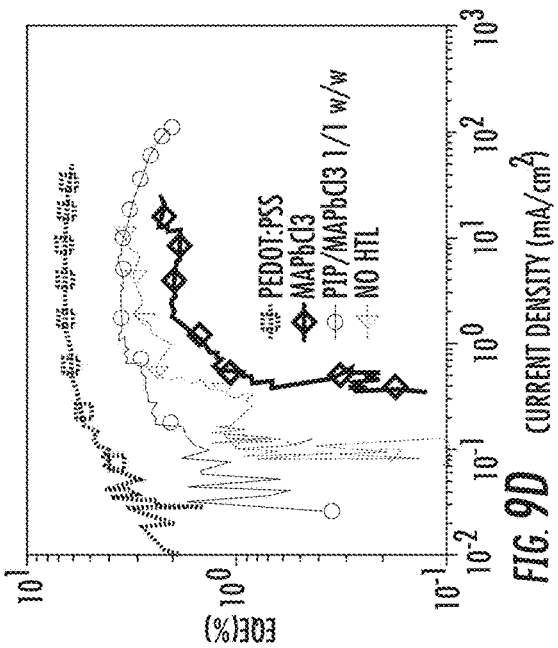
FIG. 9D depicts the EQE of various embodiments of optoelectronic devices.

The device characteristics of OLEDs without a HTL, with a PEDOT:PSS HTL, a neat MAPbCl$_3$ HTL, and a PIP-MAPbCl$_3$ (1/1 w/w) nanograss HTL were analyzed in terms of current density versus voltage (FIG. 9B), brightness versus voltage (FIG. 9C), and external quantum efficiency (EQE) versus current density (FIG. 9D).

Table 1 summarizes the major device performance values. Inserting a neat MAPbCl$_3$ HTL between the ITO electrode and the EL increased the brightness slightly from 1800 cd/cm$^2$ to 2000 cd/m$^2$, and lowered the turn-on voltage from 10.6 V to 9.4 V. This likely was due to the fact that MAPbCl$_3$: PIP-MAPbCl$_3$ (1/1 w/w) had a hole mobility of 7.5×10$^{-2}$ cm$^2$ V$^{-1}$s$^{-1}$. (See Example 5). For a neat MAPbCl$_3$ HTL with large crystals and poor surface coverage, the electron-hole balance was worse that the device without a HTL, leading to a lower maximum EQE, i.e. 2.3% vs. 3.3%. Also the long nanopillars (up to about 180 nm) in neat MAPbCl$_3$ film may have caused electrical shorts between two electrodes.

TABLE 1

Device Characteristics of OLEDs with Different HTLs.

| HTL | No HTL | PEDOT:PSS | MAPbCl$_3$ | PIP-MAPbCl$_3$ (1/1 w/w) |
|---|---|---|---|---|
| Turn-on Voltage (0.1 cd/m$^2$), V | 10.6 | 8.3 | 9.4 | 5.7 |
| Max. Brightness (@22 V), cd/m$^2$ | 1800 | 11000 | 2000 | 11600 |
| Max. EQE, % | 3.3 | 6.6 | 2.3 | 3.7 |
| Max. Power efficiency, lm/w | 1.86 | 5.50 | 1.49 | 4.20 |

As compared to the neat MAPbCl$_3$ film, it was believed that the PIP-MAPbCl$_3$ composite thin film of this example contained a greater amount of smaller nanopillars at an area with the same size, which connected the ITO substrate and the EL, resulting in devices with significantly increased current density and brightness.

Figure 9C:
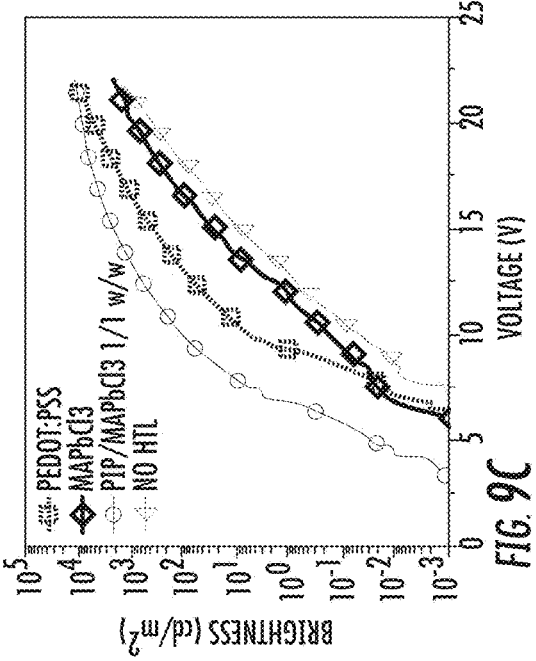
FIG. 9C depicts the brightness of various embodiments of optoelectronic devices.

The device with a PIP-MAPbCl$_3$ (1/1 w/w) HTL showed a current density more than one order of magnitude higher than the control device with PEDOT:PSS (FIG. 9B), confirming the superior charge transport property of MAPbCl$_3$. This afforded an OLED with a much higher brightness than the corresponding PEDOT:PSS device at the same operating voltage, as shown at FIG. 9C.

The turn-on voltage (@ 0.1 cd/m$^2$) of the PIP-MAPbCl$_3$ based device was 5.7 V, significantly lower than 8.3 V of the PEDOT:PSS based device, and the brightness at 10 V was 106 cd/m$^2$ versus 5.5 cd/m$^2$. With the increasing of operating voltage, the brightness was increasingly determined by the electron transport and injection. It is believed that this was why, in this example, a higher current density enabled by enhanced hole transport did not necessarily result in a higher brightness at a high operating voltage.

The maximum brightness of 11600 cd/m$^2$ was reached at 22 V for the PIP-MAPbCl$_3$ based device, only slightly higher than 11000 cd/m$^2$ at 22 V for the PEDOT:PSS based device. The unbalanced electron-hole transport limited the maximum EQE for the PIP-MAPbCl$_3$ HTL based device compared to the PEDOT:PSS based device, while the power efficiencies for both devices were more comparable (see FIG. 6), due to the higher hole conductivity of PIP-MAPbCl$_3$ than PEDOT:PSS. An improved electron transport layer was added to optimize the electron-hole balance and the EQE.

PIP-MAPbCl$_3$ composite thin films with different PIP/MAPbCl$_3$ weight ratios (1/10 and 1/2) were tested in OLEDs as well. The overall performance of those devices was inferior to the device based on a PIP-MAPbCl$_3$ (1/1 w/w) nanograss HTL, which was likely due to the formation of large perovskite crystals with low surface coverage that limited the charge injection and current density. PIP-MAPbCl$_3$ composite thin films with high PIP content (PIP/MAPbCl$_3$>1/1 w/w) formed perovskite nanopillars with reduced area density and height, which lowered the current density in this example.

Example 5—Hole Mobility Measurements

Figure 10:
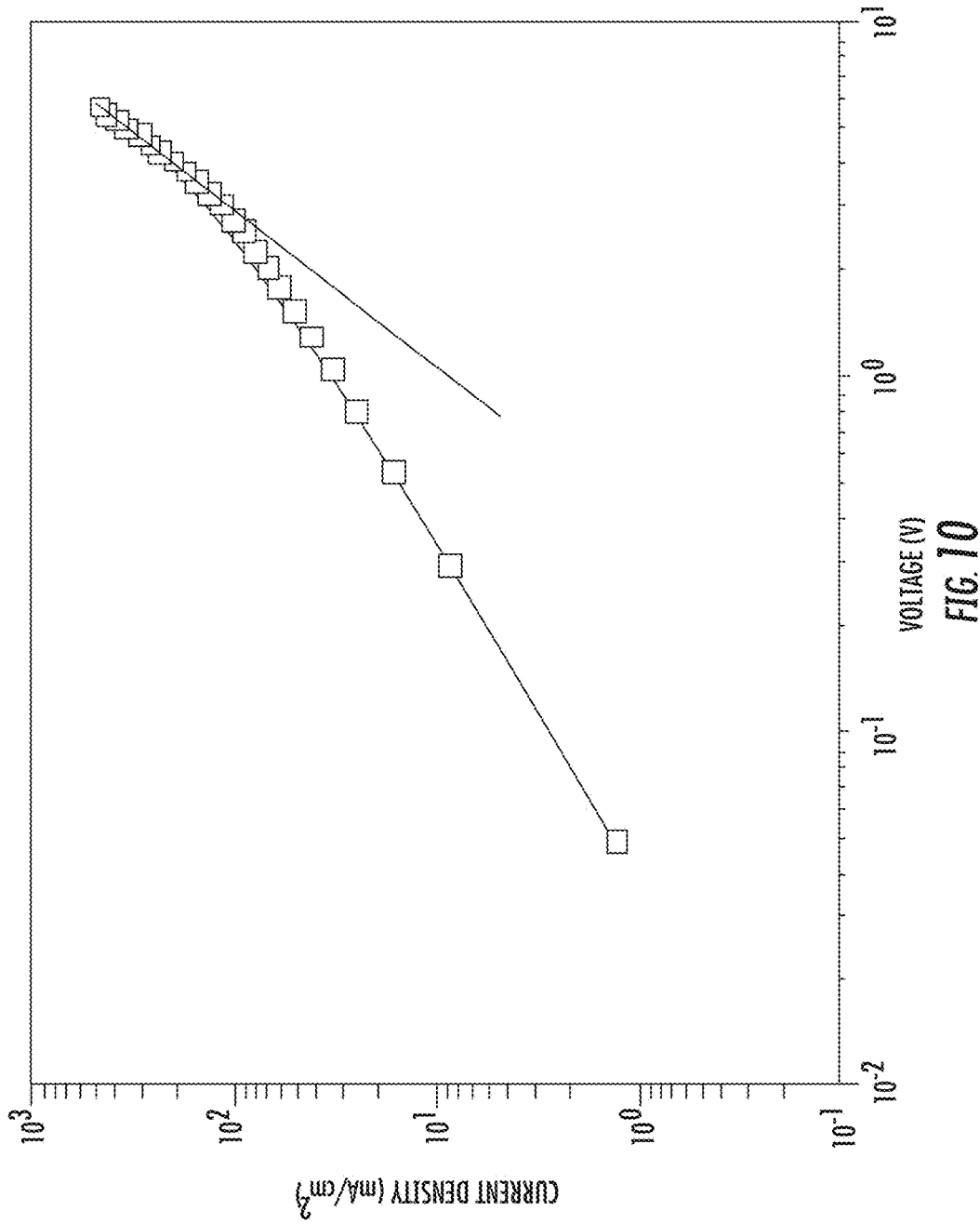
FIG. 10 depicts the current density versus voltage characteristics curve, including a linear fitting of the J-V curve, for one embodiment of a device.

The hole mobility was measured by fabricating hole-only devices with a structure of ITO (150 nm)/PIP-MAPbCl$_3$/Au (100 nm). These devices were fitted with the field-dependent space charge limited current (SCLC) method, which is described by $J_{SCLC}=9/8\varepsilon_r\varepsilon_0\mu_{h0}V^2/L^3$, where $\varepsilon_0$ is the permittivity of space, $\varepsilon_Y$ is the dielectric constant of the molecule (assumed to be 3), $\mu_{h0}$ is the zero-field hole mobility, and L is the active layer thickness (see Goh, C. et al., *Applied Physics Letters*, 2005, 86, 122110). The hole mobility of PIP-MAPbCl$_3$ composite film was calculated to be 7.5×10$^{-2}$ cm$^2$ V$^{-1}$s$^{-1}$. FIG. 10 depicts the current density versus voltage characteristics curve, including a linear fitting of the J-V curve.

We claim:

1. A method of forming a polymer-perovskite film, the method comprising:
   providing a precursor mixture comprising a polymer precursor, a perovskite precursor, and at least one liquid;
   spin casting the precursor mixture to form a film; and
   annealing the film to convert the polymer precursor to a polymer, and the perovskite precursor to a perovskite crystal, wherein the perovskite crystal comprises a methylammonium lead chloride crystal.

2. The method of claim 1, wherein the weight ratio of the polymer to the perovskite crystals in the film is about 1:10 to about 1:1.

3. The method of claim 1, further comprising:
   providing a first mixture comprising the polymer precursor and N-methyl-2-pyrrolidone;

providing a second mixture comprising the perovskite precursor, dimethyl formamide, and dimethyl sulfoxide; and combining the first mixture and the second mixture to form the precursor mixture.

4. The method of claim 3, wherein the second mixture comprises dimethyl formamide (DMF) and dimethyl sulfoxide (DMSO) at a volume ratio of about 7:3 (DMF:DMSO).

5. The method of claim 3, further comprising forming the second mixture by combining a mixture comprising methylammonium chloride ($CH_3NH_3Cl$), dimethyl formamide, and dimethyl sulfoxide with a mixture comprising lead chloride ($PbCl_2$), dimethyl formamide, and dimethyl sulfoxide.

6. The method of claim 5, wherein the mixture comprising methylammonium chloride ($CH_3NH_3Cl$), dimethyl formamide, and dimethyl sulfoxide has a concentration of methylammonium chloride of about 0.15 M to about 0.25 M.

7. The method of claim 5, wherein the mixture comprising lead chloride ($PbCl_2$), dimethyl formamide, and dimethyl sulfoxide has a concentration of lead chloride of about 0.05 M to about 0.15 M.

8. The method of claim 1, wherein the at least one liquid comprises N-methyl-2-pyrrolidone, dimethyl formamide, dimethyl sulfoxide, or a combination thereof.

9. The method of claim 1, wherein the polymer precursor is a polyimide precursor.

10. The method of claim 1, wherein the annealing comprises heating the film to a temperature of about 50° C. to about 100° C.

11. The method of claim 1, wherein the methylammonium lead chloride crystals are nanopillar crystals.

12. The method of claim 11, wherein the nanopillar crystals are substantially uniformly dispersed in the polymer.

13. The method of claim 11, wherein the nanopillar crystals are oriented substantially perpendicularly to a surface of the polymer.

14. The method of claim 11, wherein the nanopillar crystals have an average length of about 25 nm to about 250 nm, and an average width of about 2 nm to about 10 nm.

* * * * *